United States Patent
Ishii et al.

(10) Patent No.: US 9,528,622 B2
(45) Date of Patent: Dec. 27, 2016

(54) VENTILATION MEMBER

(71) Applicant: NITTO DENKO CORPORATION, Ibaraki-shi, Osaka (JP)

(72) Inventors: Kyoko Ishii, Osaka (JP); Youzou Yano, Osaka (JP); Yoshiki Ikeyama, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/084,231

(22) Filed: Nov. 19, 2013

(65) Prior Publication Data
US 2014/0137739 A1 May 22, 2014

(30) Foreign Application Priority Data
Nov. 20, 2012 (JP) ................. 2012-254062

(51) Int. Cl.
*B01D 53/22* (2006.01)
*F16K 24/04* (2006.01)
*F24F 7/00* (2006.01)
*F21V 31/03* (2006.01)
(Continued)

(52) U.S. Cl.
CPC ............. *F16K 24/04* (2013.01); *F21V 31/03* (2013.01); *F24F 7/00* (2013.01); *H05K 5/0213* (2013.01); *F21S 48/332* (2013.01)

(58) Field of Classification Search
CPC ............. F16K 24/04; F16K 24/00; F24F 7/00; F21V 31/03; H05K 5/0213
See application file for complete search history.

(56) References Cited

U.S. PATENT DOCUMENTS 3,190,321 A * 6/1965 Robinson ............... F16K 24/04
                                                        134/10
4,828,587 A * 5/1989 Baurmeister ........... A61M 5/36
                                                        210/188
6,851,638 B2 * 2/2005 Maeda et al. .................. 242/321
(Continued)

FOREIGN PATENT DOCUMENTS

EP    1 970 258    9/2008
EP    1 997 685    12/2008
(Continued)

OTHER PUBLICATIONS

"Surface" Random House Kernerman Webster's College Dictionary, 2010 K Dictionaries Ltd. Copyright 2005, 1997, 1991 by Random House, Inc. 1 pg. <thefreedictionary.com/surface>.*
(Continued)

*Primary Examiner* — Anthony Shumate
(74) *Attorney, Agent, or Firm* — Hamre, Schumann, Mueller & Larson, P.C.

(57) ABSTRACT

A ventilation member is configured to be attached to an opening portion of a housing, and includes: an inner member configured to be fitted to the opening portion and including a tubular portion having a through hole configured to serve as a part of a ventilation path between a space inside the housing and a space outside the housing; and an outer member mounted to the inner member and covering a water-proof gas-permeable membrane attached so as to close an opening of the through hole. The inner member and the outer member have an exposed surface subjected to liquid-repellent treatment.

8 Claims, 8 Drawing Sheets

(51) Int. Cl.
*H05K 5/02* (2006.01)
*F21S 8/10* (2006.01)

(56) References Cited

U.S. PATENT DOCUMENTS

| | | | | |
|---|---|---|---|---|
| 7,442,352 | B2* | 10/2008 | Lu | B01D 53/02 |
| | | | | 423/210 |
| 7,789,159 | B1* | 9/2010 | Bader | B01D 61/04 |
| | | | | 166/279 |
| 8,336,717 | B2* | 12/2012 | Zia | 210/472 |
| 8,414,672 | B2 | 4/2013 | Furuyama et al. | |
| 2001/0018096 | A1* | 8/2001 | Klare | B01D 67/0088 |
| | | | | 427/385.5 |
| 2004/0226444 | A1* | 11/2004 | Leahey | 96/6 |
| 2006/0065250 | A1* | 3/2006 | Weldon | F02M 25/0836 |
| | | | | 123/516 |
| 2010/0034494 | A1* | 2/2010 | Hori | 384/114 |
| 2013/0012117 | A1 | 1/2013 | Uemura et al. | |
| 2014/0319998 | A1* | 10/2014 | Han | 313/504 |
| 2015/0075966 | A1* | 3/2015 | Ono | C02F 1/043 |
| | | | | 203/10 |

FOREIGN PATENT DOCUMENTS

| | | |
|---|---|---|
| EP | 2 269 874 | 1/2011 |
| JP | 4-115405 | 4/1992 |
| JP | 2007-087666 | 4/2007 |
| JP | 2007-087929 | 4/2007 |
| JP | 2011-198615 | 10/2011 |

OTHER PUBLICATIONS

"Rubber" American Heritage Dictionary of the English Language, Fifth Edition. 2011, 1 p. <http://www.thefreedictionary.com/rubber>.*

* cited by examiner

VENTILATION MEMBER

BACKGROUND OF THE INVENTION

1. Field of the Invention

The present invention relates to a ventilation member configured to be attached to an opening of a housing.

2. Description of Related Art

Conventionally, for example, in automobile electric components such as automobile lamps and ECUs (Electrical Control Units), OA (office automation) equipment, household electric appliances, and medical devices, a housing containing an electric component or a control board is provided with an opening for the purpose of reducing pressure variation in the housing caused by temperature change or allowing replacement of air in the housing, and a ventilation member is attached to the opening. The ventilation member ensures ventilation between the inside and outside of the housing, and also prevents foreign matters such as dust and water from entering the housing. Examples of such a ventilation member are disclosed in JP 2007-87929 A and JP 2007-87666 A.

For example, JP 2007-87929 A discloses a ventilation member 100 as shown in FIG. 6. The ventilation member 100 is composed of a tubular cover component 101 having a bottom, a tubular body 102 made of rubber, and a gas-permeable membrane 103. The tubular body 102 has a slightly smaller diameter than the cover component 101, and the gas-permeable membrane 103 is disposed so as to close one opening of the tubular body 102. The tubular body 102 is fitted into the cover component 101 by inserting the portion of the tubular body 102 on the gas-permeable membrane 103 side into the cover component 101. Thus, a ventilation path 104 is formed between the inner peripheral surface of the cover component 101 and the outer peripheral surface of the tubular body 102 and between the bottom surface of the cover component 101 and the gas-permeable membrane 103. An opening portion 150a formed in a housing 150 is inserted in the tubular body 102, and thus the ventilation member 100 can be attached to the housing 150.

As shown in FIG. 7 and FIG. 8, a ventilation member 200 disclosed in JP 2007-87666 A includes an inner member 202 on which a gas-permeable membrane 203 is disposed, and a protecting portion 201 fitted to the inner member 202 so as to cover the gas-permeable membrane 203. A plurality of opening portions 201a are formed in the top or side of the protecting portion 201. Such a ventilation member 200 is fixed to an opening portion 250a of a housing 250 via a sealing member 205. A gas having permeated the gas-permeable membrane 203 passes through the opening portions 201a of the protecting portion 201, as a result of which ventilation between the inside and outside of the housing 250 can be ensured. The protecting portion 201 prevents the gas-permeable membrane 203 from being damaged by an external force, and prevents the gas permeability of the gas-permeable membrane 203 from being reduced by accumulation of dust.

SUMMARY OF THE INVENTION

For example, in the case of an electric component of an automobile, when the body or engine room of the automobile is washed, a washing liquid containing a surfactant may adhere to the electric component of the automobile. In addition, when an oil such as an ATF or a washing liquid such as a window washer liquid is replaced by a new one, the oil or the washing liquid may adhere to the electric component of the automobile. In the case of the ventilation member 100 of JP 2007-87929 A, a slight clearance is formed between the cover component 101 and the tubular body 102 and between the tubular body 102 and the housing 150. Furthermore, in the case of the ventilation member 200 of JP 2007-87666 A, a clearance is formed between the housing 250 and a peripheral wall portion of the protecting portion 201 that is located outwardly of the sealing member 205. Therefore, when an oil or a washing liquid adheres to the electric component of the automobile as described above, the liquid may enter the inside of the housing 150 or 250 though a slight clearance.

In view of such circumstances, the present invention aims to provide a ventilation member adapted to prevent entry of an oil or a washing liquid into a housing.

That is, the present invention provides a ventilation member capable of being attached to an opening portion of a housing, the ventilation member including: an inner member configured to be fitted to the opening portion and including a tubular portion having a through hole configured to serve as a part of a ventilation path between a space inside the housing and a space outside the housing; and an outer member mounted to the inner member and covering an opening of the through hole. The inner member and the outer member have an exposed surface subjected to liquid-repellent treatment.

According to the present invention, the inner member and the outer member have exposed surfaces subjected to liquid-repellent treatment. Therefore, it is possible to prevent an oil or a washing liquid from entering the inside of the housing through a gap between the ventilation member and the housing.

DETAILED DESCRIPTION OF THE INVENTION

Hereinafter, embodiments of the present invention will be described with reference to the accompanying drawings. The following description relates to illustrative examples of the present invention, and the present invention is not limited by these examples.

An "exposed surface" of the inner member, the outer member, the water-proof gas-permeable membrane, or the sealing member means a surface exposed to an external atmosphere. Whether a surface is an "exposed surface" in a single unit assembled from these components is determined when the components are in a state of being assembled together as a single unit. For example, whether surfaces of the inner member and the outer member of the ventilation member are "exposed surfaces" is determined not when the inner member and the outer member are in a state of being separated from each other, but when these members are in a state of being assembled together as components of the ventilation member. In this example, a surface of the inner member and a surface of the outer member that are in contact with each other do not correspond to exposed surfaces.

First Embodiment

Figure 1:
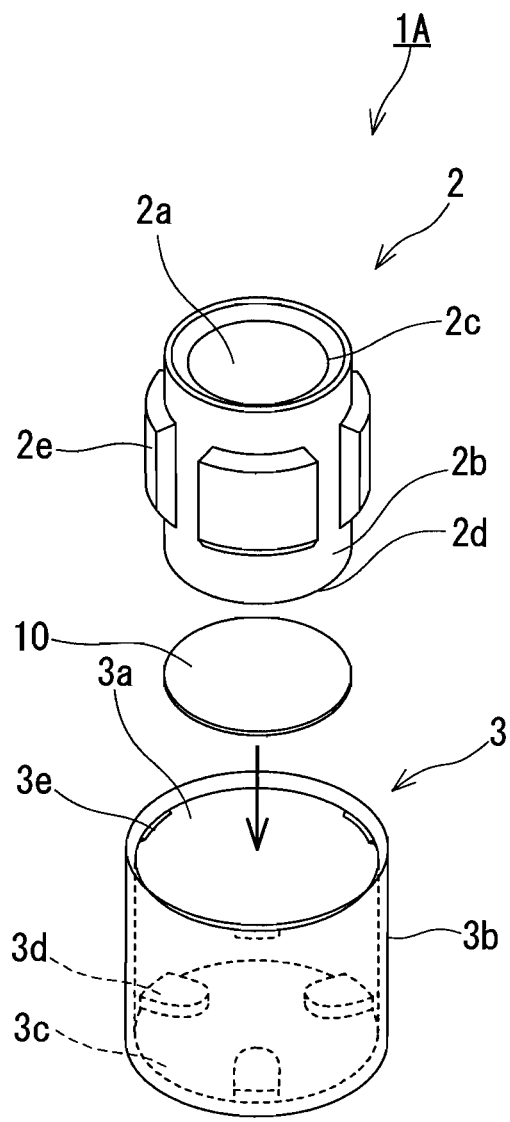
FIG. 1 is an exploded perspective view of a ventilation member according to a first embodiment of the present invention.
Figure 2:
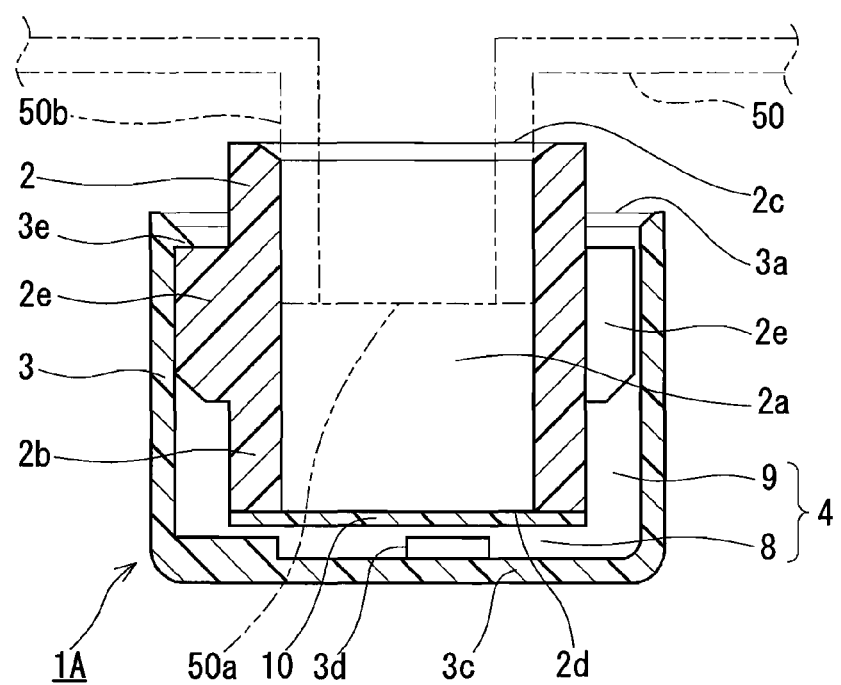
FIG. 2 is a cross-sectional view of the ventilation member shown in FIG. 1.

As shown in FIG. 1 and FIG. 2, a ventilation member 1A according to a first embodiment of the present invention is configured to be attached to an opening portion 50a of a housing 50. The opening portion 50a includes a through hole for allowing communication between a space inside the housing 50 and a space outside the housing 50, and is provided in a cylindrical neck portion 50b projecting from an outer surface of the housing 50. The ventilation member 1A includes: an inner member 2 configured to be fitted to the opening portion 50a and including a tubular potion having a through hole 2a configured to serve as a part of a ventilation path 4 between the space inside the housing 50 and the space outside the housing 50; and an outer member 3 mounted to an outside portion of the inner member 2 and covering a water-proof gas-permeable membrane 10 attached so as to close an opening of the through hole 2a. More specifically, the outer member 3 is mounted on a surface of the inner member 2 other than the inner surface of the tubular portion. Each of the inner member 2, the outer member 3, and the water-proof gas-permeable membrane 10 is entirely subjected to liquid-repellent treatment. That is, all of the exposed surfaces of the inner member 2, the outer member 3, and the water-proof gas-permeable membrane 10 are subjected to liquid-repellent treatment.

The inner member 2 is formed of an elastomer. More specifically, the inner member 2 is a tubular member made of a thermoplastic elastomer. The inner member 2 has: a cylindrical tube portion 2b configured to be fitted to the opening portion 50a and having the through hole 2a thereinside; and four projecting portions 2e formed in a central region of the outer peripheral surface of the tube portion 2b in such a manner as to project outwardly and to be arranged at regular intervals in the peripheral direction. The projecting portions 2e are disposed in such a manner that the outside portions of the projecting portions 2e come into contact with the inside portion of the outer member 3. The outer diameter of the inner member 2 defined by the regions where the projecting portions 2e are formed is slightly larger than the inner diameter of the outer member 3. In this embodiment, when the outer member 3 is mounted to the inner member 2, the projecting portions 2e are elastically deformed to fix the outer member 3 to the inner member 2.

The through hole 2a has a first opening portion 2c configured to be fitted to the opening portion 50a, and a second opening portion 2d provided on the opposite side from the first opening portion 2c and having the water-proof gas-permeable membrane 10 attached thereto. The first opening portion 2c communicates with the space inside the housing 50 via the opening portion 50a. The second opening portion 2d communicates with the space outside the housing 50 via the water-proof gas-permeable membrane 10 and communication paths 8 and 9 formed as a part of the ventilation path 4 between the outside portion of the inner member 2 and the inside portion of the outer member 3. The communication path 8 is a clearance formed between the water-proof gas-permeable membrane 10 and a bottom portion 3c of the outer member 3. The communication path 9 is a clearance formed between the inside portion of the outer member 3 and the region of the outer peripheral portion of the inner member 2 in which the projecting portions 2e are not formed. The ventilation path 4 is constituted by the through hole 2a of the inner member 2 and the communication paths 8 and 9 between the outside portion of the inner member 2 and the inside portion of the outer member 3. In this embodiment, a gas is allowed to flow from the space inside the housing 50 to the space outside the housing 50 via the opening portion 50a of the housing 50, the through hole 2a of the inner member 2, the communication paths 8 and 9 between the outside portion of the inner member 2 and the inside portion of the outer member 3, and an opening portion 3a of the outer member 3.

The outer member 3 is formed of a resin. More specifically, the outer member 3 is a tubular member having a bottom and made of PP (polypropylene). The outer member 3 has: a tube portion 3b having an opening portion 3a mounted to the outside portion of the inner member 2; and the bottom portion 3c provided on the opposite side from the opening portion 3a and having an inside portion facing the second opening portion 2d of the inner member 2 and the water-proof gas-permeable membrane 10. Three rest portions 3d are formed along the peripheral edge of the inside portion of the bottom portion 3c in such a manner as to be arranged at regular intervals in the peripheral direction. In addition, three engagement pieces 3e are formed along the inner peripheral edge of the opening portion 3a in such a manner as to project inwardly and to be arranged at regular intervals.

When the inner member 2 is in a state of being fitted in the outer member 3, the outer peripheral surfaces of the projecting portions 2e are in contact with, and press, the inner peripheral surface of the outer member 3, and the upper surfaces of the projecting portions 2e are engaged with the engagement pieces 3e. Furthermore, when the inner member 2 is in a state of being fitted in the outer member 3, even if the inner member 2 is inserted up to the bottom surface of the outer member 3, the communication path 8 is formed between the bottom portion 3c of the outer member 3 and the second opening portion 2d of the inner member 2 since the rest portions 3d formed on the bottom surface of the outer member 3 and the second opening portion 2d of the inner member 2 come into contact with each other.

The inner member 2 and the outer member 3 may be formed of the same material or may be formed of different materials. From the standpoint of moldability and welding, thermoplastic resins, such as PA (polyamide), PET (polyethylene terephthalate), PPS (polyphenylene sulfide), PBT (polybutylene terephthalate), PC (polycarbonate), PP (polypropylene), and PPE (polyphenylene ether), are preferably used as the materials.

Both the inner member 2 and the outer member 3 may be elastic bodies. Thermosetting resin elastic bodies, such as NBR (nitrile rubber), EPDM (ethylene-propylene rubber), silicone rubber, fluorine rubber, acrylic rubber, and hydrogenated nitrile rubber, are preferable as the materials of the elastic bodies. In addition, elastic resins such as thermoplastic elastomers may be used.

The structure and material of the water-proof gas-permeable membrane 10 are not particularly limited as long as the water-proof gas-permeable membrane 10 is a membrane that allows permeation of gases and that blocks permeation of liquids (e.g., a woven fabric, a non-woven fabric, a mesh, or a net, which is made of resin or metal). For example, the water-proof gas-permeable membrane 10 may have a configuration in which a reinforcing layer is laminated on a resin porous membrane. By providing a reinforcing layer, the water-proof gas-permeable membrane 10 of high strength can be obtained.

A fluororesin porous body or a polyolefin porous body that can be produced by a commonly-known stretching method or extraction method is usable as the material of the resin porous membrane. Examples of the fluororesin include PTFE (polytetrafluoroethylene), polychlorotrifluoroethylene, tetrafluoroethylene-hexafluoropropylene copolymer, and tetrafluoroethylene-ethylene copolymer. Examples of monomers constituting the polyolefin include ethylene, propylene, and 4-methylpentene-1,1-butene. A polyolefin obtained by polymerization of any one of these monomers or a polyolefin obtained by copolymerization of these monomers can be used. Alternatively, for example, a nanofiber film porous body for which polyacrylonitrile, nylon, or polylactic acid is used can be used. In particular, it is preferable to use a PTFE porous body that can ensure gas permeability even with a small area and that functions well to prevent entry of foreign matters into the housing. In addition, from the standpoint of ensuring sufficient water-proofness, the average pore diameter of the resin porous membrane is desirably 0.01 µm or more and 10 µm or less.

A material having better gas permeability than the resin porous membrane is preferably used as the material of the reinforcing layer. Specifically, a woven fabric, a non-woven fabric, a mesh, a net, a sponge, a foam, or a porous body, which is made of resin or metal, can be used. Examples of the method for joining together the resin porous membrane and the reinforcing layer include adhesive lamination, thermal lamination, heat welding, ultrasonic welding, and bonding using an adhesive.

It is advantageous that the thickness of the water-proof gas-permeable membrane 10 be adjusted, for example, within a range of 1 µm to 5 mm, in view of the strength and the ease of fixing to the inner member 2. The gas permeability of the resin porous membrane or the water-proof gas-permeable membrane 10 is preferably 0.1 to 300 sec/100 mL in terms of Gurley value.

Each of the outer member 3 and the inner member 2 having the water-proof gas-permeable membrane 10 attached thereto is entirely subjected to liquid-repellent treatment. All of the exposed surfaces of the inner member 2 and the water-proof gas-permeable membrane 10 are subjected to liquid-repellent treatment, and the entire surface of the outer member 3 is subjected to liquid-repellent treatment. The liquid-repellent treatment can be carried out by a commonly-known method. The liquid-repellent agent used for the liquid-repellent treatment is not particularly limited, and is typically a material containing a polymer having a perfluoroalkyl group. Oil-repellent treatment is a treatment for forming an oil-repellent film containing a polymer having a perfluoroalkyl group. The method for forming an oil-repellent film is not particularly limited, and may be any method that allows formation of a desired film. Examples of the method include: coating methods in which coating with a solution or a dispersion of a polymer having a perfluoroalkyl group is performed by air spraying, electrostatic spraying, dip coating, spin coating, roll coating (including kiss coating and gravure coating), curtain flow coating, impregnation, or the like; and film forming methods using electrodeposition coating or plasma polymerization.

In the ventilation member 1A of the present embodiment having been described above, the inner member 2 and the outer member 3 have exposed surfaces subjected to liquid-repellent treatment. Therefore, it is possible to prevent an oil or a washing liquid from entering the inside of the housing 50 through a gap between the ventilation member 1A and the housing 50.

Second Embodiment

Next, a ventilation member 1B according to a second embodiment of the present invention will be described with reference to FIG. 3 and FIG. 4. In the present embodiment, the same components as those described in the first embodiment are denoted by the same reference characters, and the description thereof is omitted in some cases.

Figure 3:
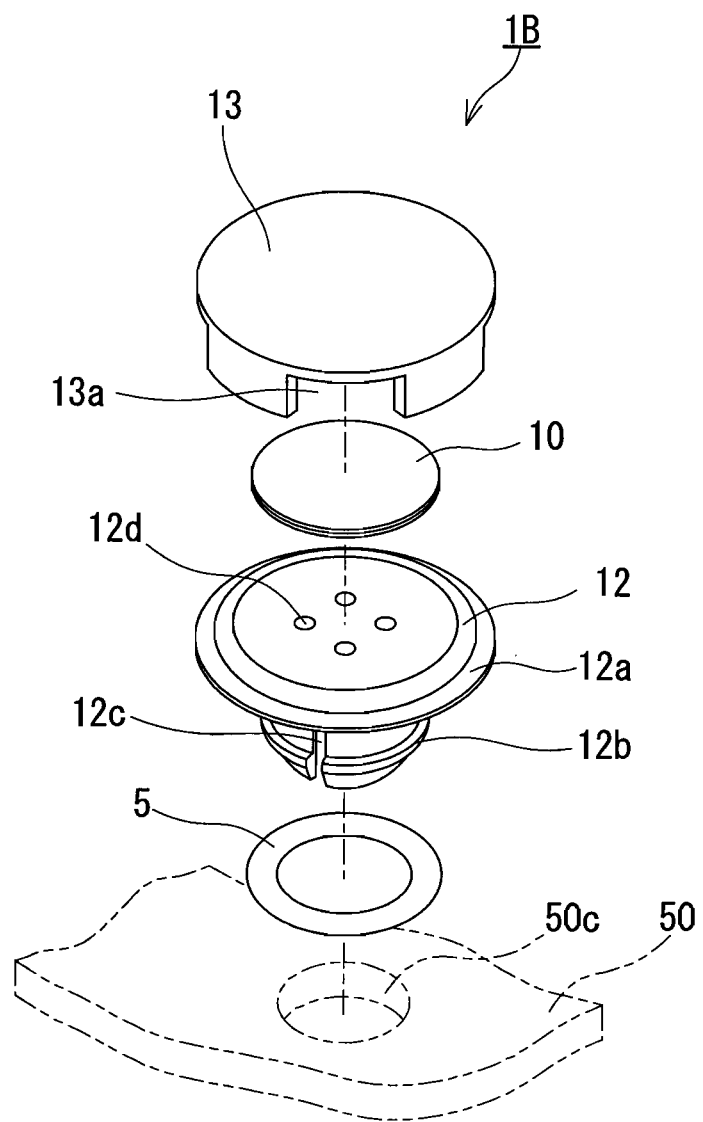
FIG. 3 is an exploded perspective view of a ventilation member according to a second embodiment of the present invention.
Figure 4:
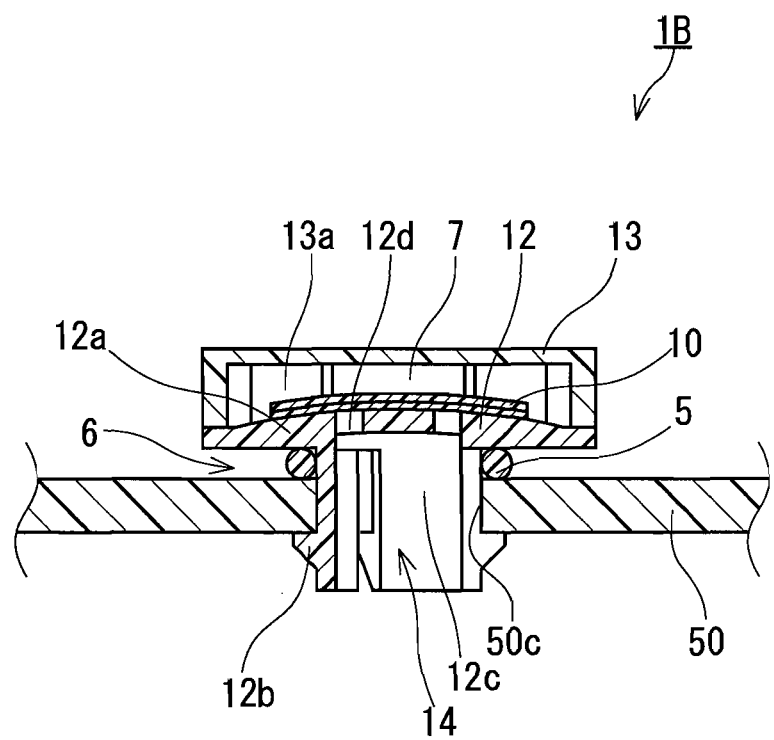
FIG. 4 is a cross-sectional view of a ventilation member shown in FIG. 3.

As shown in FIG. 3 and FIG. 4, the ventilation member 1B according to the second embodiment of the present invention is configured to be attached to an opening portion 50c of a housing 50. The opening portion 50c includes a circular through hole for allowing communication between a space inside the housing 50 and a space outside the housing 50. The ventilation member 1B includes: an inner member 12 configured to be fitted to the opening portion 50c and including a tubular portion having a through hole 12c configured to serve as a part of a ventilation path 14 between the space inside the housing 50 and the space outside the housing 50; a tubular outer member 13 having a bottom, mounted to an outside portion of the inner member 12, and covering the water-proof gas-permeable membrane 10 attached so as to close openings of vent holes 12d communicating with the through hole 12c; and a sealing member 5 mounted so as to be placed around the opening portion 50c in a clearance 6 between the inner member 12 and the housing 50. More specifically, the outer member 13 is mounted on a surface of the inner member 12 other than the inner surface of the tubular portion. All of the exposed surfaces of the inner member 12, the outer member 13, and the sealing member 5 are subjected to liquid-repellent treatment.

The inner member 12 is a member made of synthetic resin. The inner member 12 has: a head portion 12a having a large diameter; and a locking portion 12b formed at a lower end of the head portion 12a to have a diameter smaller than that of the head portion 12a, and having the through hole 12c thereinside. Four vent holes 12d communicating with the through hole 12c are formed in a central region of the head portion 12a. The water-proof gas-permeable membrane 10 is fixedly attached to the upper surface of the head portion 12a so as to cover the vent holes 12d. The locking portion 12b has the shape of a cylinder having a diameter approximately equal to the diameter of the opening portion 50c of the housing 50. At least an insertion end portion (a portion to be inserted first into the opening portion 50c) of the locking portion 12b is divided into a plurality of sections in the peripheral direction. The locking portion 12b includes a plurality of leg portions formed at least in the insertion end portion, and slits are formed between the leg portions adjacent to each other. Each of the plurality of leg portions has a locking projection formed at the extremity of the insertion end portion and having a tapered outer periphery.

In order for the ventilation member 1B to be fixed to the opening portion 50c of the housing 50, the locking portion 12b is inserted into the opening portion 50c. When the locking portion 12b is inserted into the opening portion 50c, the locking projections of the locking portion 12b are pressed by the opening portion 50c, and the divided leg portions of the locking portion 12b are bent inwardly. When the locking portion 12b is inserted further, the locking projections of the locking portion 12b penetrate into the housing 50. The locking projections of the locking portion 12b that have been released from the pressing are locked by the inner surface of the housing 50, and thus the ventilation member 1B is fixed to the housing 50. Once the ventilation member 1B is fixed to the housing 50, the ventilation member 1B cannot be externally detached from the housing 50 unless the ventilation member 1B is pulled so hard that the ventilation member 1B or the housing 50 is broken. That is, the ventilation member 1B is structured so as not to be easily detached from the housing 50.

In the example shown in FIG. 3 and FIG. 4, the insertion end portion of the locking portion 12b is divided into three sections in the peripheral direction. However, the present invention is not limited thereto. The number of divided sections may be two or may be four or more. In addition, in the example shown in FIG. 3 and FIG. 4, the locking portion 12b is divided into a plurality of sections by slitting the locking portion 12b partially in the longitudinal direction. However, the present invention is not limited thereto. The locking portion 12b may be divided into a plurality of sections by slitting the locking portion 12b entirely in the longitudinal direction. In addition, all of the plurality of leg portions of the locking portion 12b include locking projections. However, at least one leg portion only needs to include a locking projection. Preferably, two or more leg portions include locking projections. In addition, it is advantageous that the locking projection be formed so as to extend from a position at a distance of 0.1 mm or more from the extremity of the insertion end portion of the locking portion 12b. In addition, in order to facilitate insertion of the locking portion 12b into the opening portion 50c of the housing 50, the locking portion 12b may have a straight section in the extremity of the insertion end portion.

The shape of the head portion 12a of the inner member 12 is not particularly limited. In the example shown in FIG. 3 and FIG. 4, the head portion 12a is in the shape of a disc having a larger diameter than the locking portion 12b. The head portion 12a has a larger diameter than the opening portion 50c formed in the housing 50, and can be disposed so as to cover the opening portion 50c. In addition, as shown in FIG. 4, the top surface of the head portion 12a that is covered with the water-proof gas-permeable membrane 10 is a curved surface in which its peripheral edge region is located lower than its central region. The ventilation member 1B including the head portion 12a having such a curved top surface has an improved water removal performance, and is thus suitable as a ventilation member 1B for the housing 50 that is used in an environment where the housing 50 is likely to be subject to influence of water. Alternatively, the water removal performance can be improved, for example, by forming the head portion 12a into the shape of a cone and fixedly attaching the water-proof gas-permeable membrane 10 to the inclined surface of the cone, instead of forming the top surface of the head portion 12a into a curved surface.

The size of the through hole 12c of the inner member 12 may be determined as appropriate in consideration of the type of the housing 50 to which the ventilation member 1B is fixed and in consideration of the amount of gas permeating the water-proof gas-permeable membrane 10. It is advantageous that the area of the through hole 12c (the area of the face that is orthogonal to the direction in which a gas passes through the ventilation member) be 0.001 to 100 cm$^2$. In addition, as shown in FIG. 4, the through hole 12c includes the plurality of vent holes 12d formed separately from each other in the face covered with the water-proof gas-permeable membrane 10. When the plurality of vent holes 12d are thus formed in the face covered with the water-proof gas-permeable membrane 10, the central region of the water-proof gas-permeable membrane 10 is also supported by the head portion 12a. Therefore, breakage of the water-proof gas-permeable membrane 10 caused by an external force can be prevented.

Figure 5:
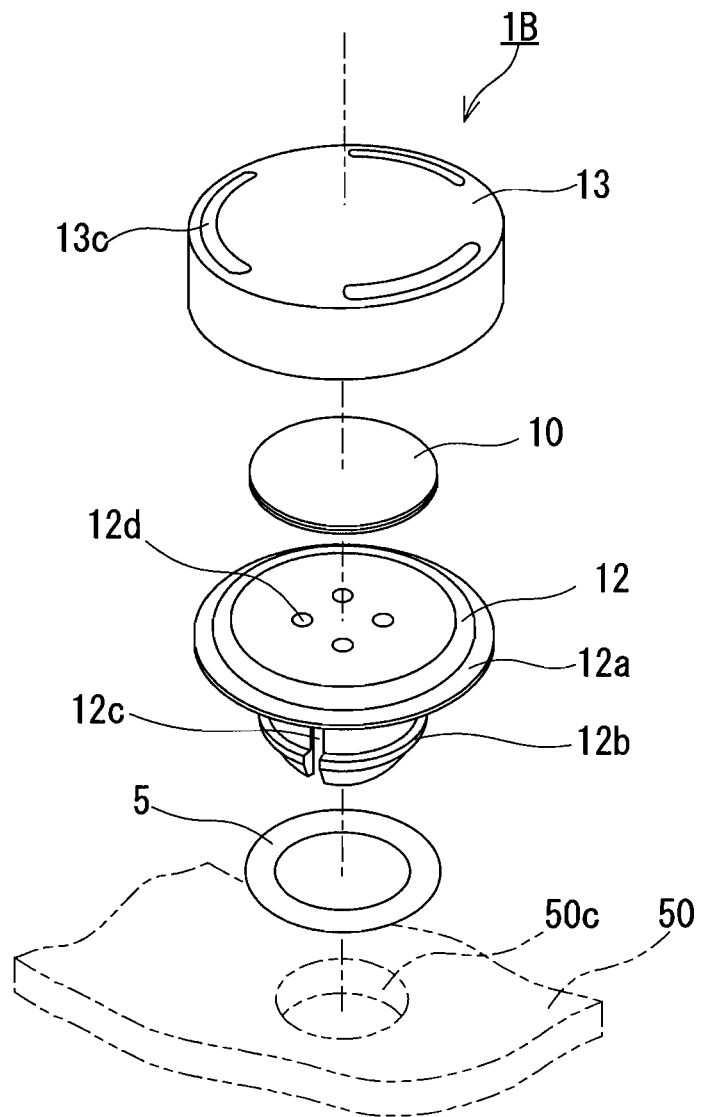
FIG. 5 is an exploded perspective view of a ventilation member according to an example of modification of the present invention.
Figure 6:
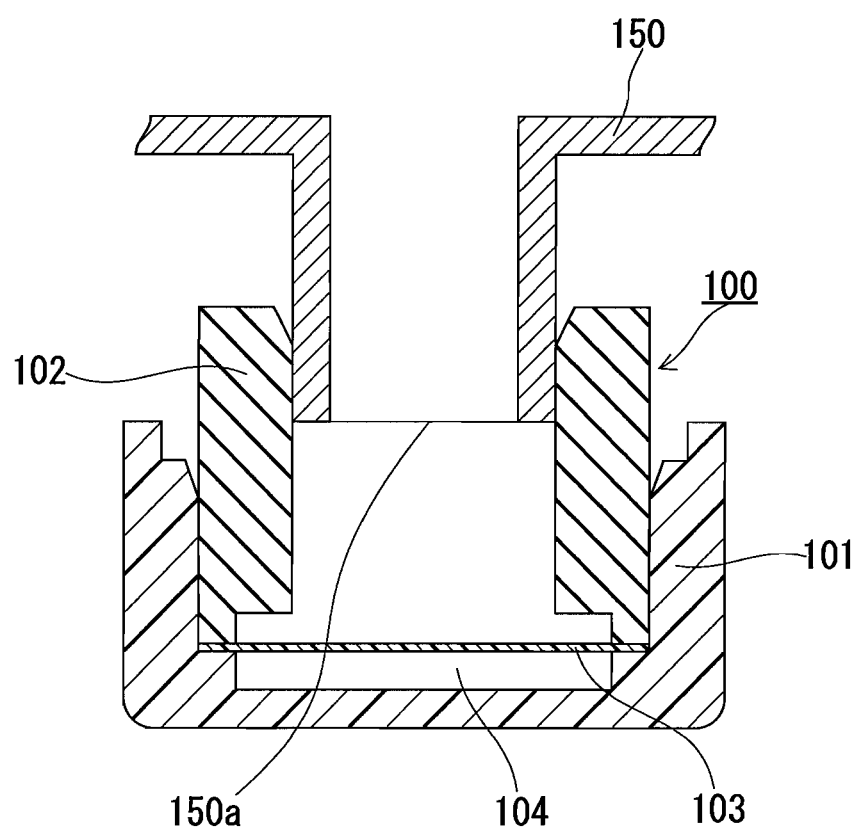
FIG. 6 is a cross-sectional view of a conventional ventilation member.
Figure 7:
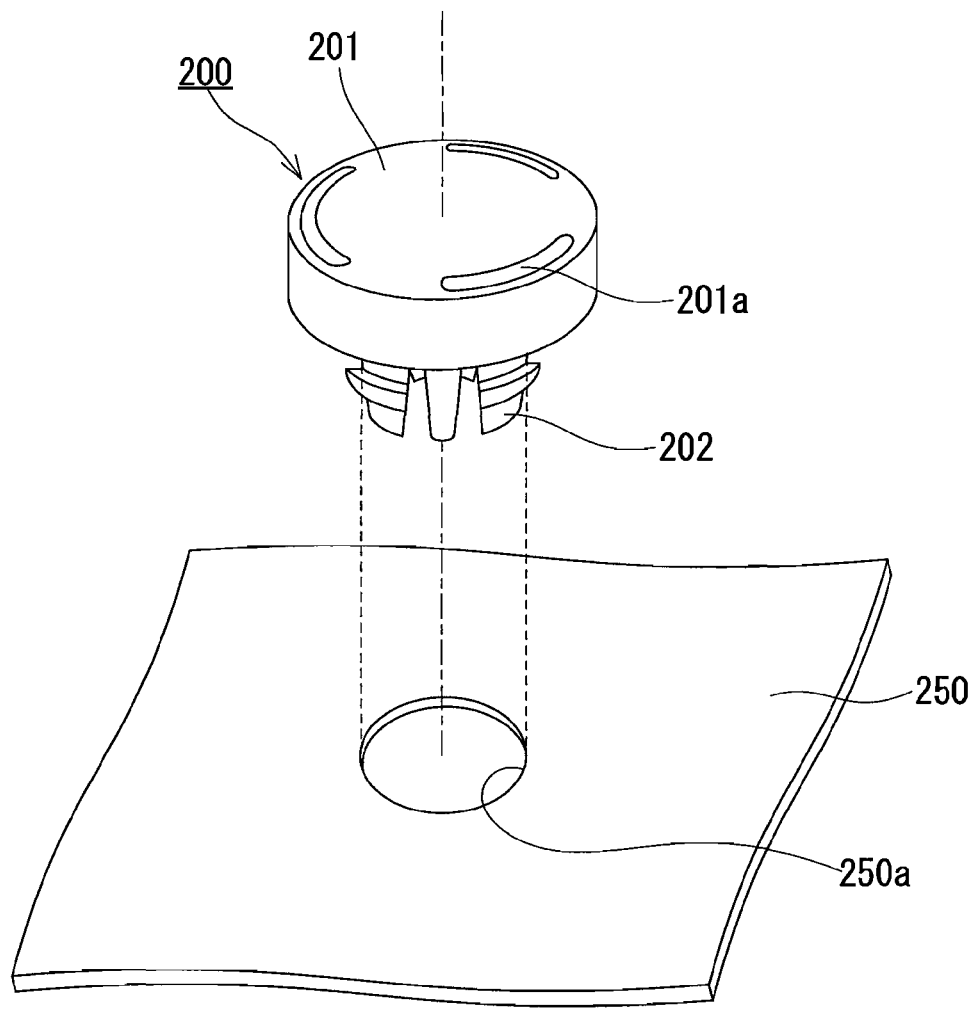
FIG. 7 is an exploded perspective view of another conventional ventilation member.
Figure 8:
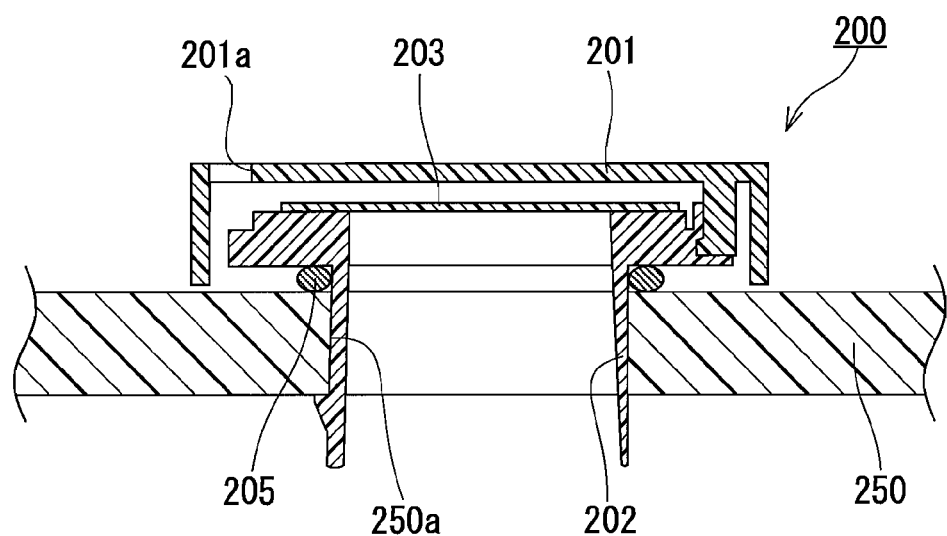
FIG. 8 is a cross-sectional view of the ventilation member shown in FIG. 7.

The outer member 13 is a tubular member having a bottom and made of synthetic resin. The outer member 13 is a protecting member mounted to the head portion 12a of the inner member 2 and covering the water-proof gas-permeable membrane 10 attached so as to close the openings of the vent holes 12d communicating with the through hole 12c. The outer member 13 is formed to have an outer diameter approximately equal to the outer diameter of the head portion 12a of the inner member 2, and the outer member 13 covers the entire upper surface of the head portion 12a. A space is formed between the outside portion of the inner member 12 and the inside portion of the outer member 13. This space functions as a communication path 7 serving as a part of the ventilation path 14 for allowing a gas to flow from the space inside the housing 50 to the space outside the housing 50. By providing such an outer member 13, it is possible to reduce the risk that the water-proof gas-permeable membrane 10 is damaged by an external force, or that ventilation is hindered by sand or mud accumulated on the surface of the water-proof gas-permeable membrane 10. The shape of the outer member 13 is not particularly limited, and may be any shape that does not impair the gas permeability of the ventilation member 1B. Preferably, a plurality of opening portions 13a are formed in a location, such as the side surface of the outer member 13, which cannot be seen when the ventilation member is viewed in the direction in which a gas passes through the ventilation member. Alternatively, opening portions 13c may be formed in the upper surface of the outer member 13 as shown in FIG. 5, as long as the effect of protection of the water-proof gas-permeable membrane 10 is not impaired. In addition, from the standpoint of maintaining the strength of the outer member 13 and preventing entry of substances effectively, the opening portions 13a are preferably in the form of separate small holes.

As shown in FIG. 4, the ventilation path 14 is constituted by the through hole 12c of the inner member 12, the vent holes 12d communicating with the through hole 12c, and the communication path 7 between the outside portion of the inner member 12 and the inside portion of the outer member 13. In this embodiment, a gas is allowed to flow from the space inside the housing 50 to the space outside the housing 50 via the opening portion 50c of the housing 50, the through hole 12c of the inner member 12, the communication path 7 between the outside portion of the inner member 12 and the inside portion of the outer member 13, and the opening portions 13a of the outer member 13.

The sealing member 5 is mounted so as to be placed around the opening portion 50c of the housing 50 in the clearance 6 between the inner member 12 and the housing 50. By providing such a sealing member 5, gas tightness and closeness of contact between the housing 50 and the ventilation member 1B can be enhanced. Particularly, when the inner member 12 is made of a thermoplastic resin other than elastomers, the sealing member 5 is preferably formed to increase the hermeticity. The sealing member 5 is formed of an elastomer. More specifically, the sealing member 5 is formed of an elastomer such as nitrile rubber (NBR), ethylene-propylene rubber (EPM, EPDM), silicone rubber, fluorine rubber, acrylic rubber, and hydrogenated nitrile rubber. Preferred materials other than elastomers include foams, and foams having an adhesive layer. For example, the sealing member 5 may be provided in the form of an O-ring or the like that is made of any one of the aforementioned materials and that is fitted around the outer side of the locking portion 12b. Alternatively, the sealing member 5 may be formed on one surface of the head portion 12a by two-color molding. In addition, a foam having an adhesive layer may be adhered to the surface of the head portion 12a that faces the housing 50.

All of the exposed surfaces of the inner member 12 having the water-proof gas-permeable membrane 10 attached thereto, the outer member 13, and the sealing member 5, are subjected to liquid-repellent treatment after the outer member 13 and the sealing member 5 are mounted to the inner member 12 having the water-proof gas-permeable membrane 10 attached thereto. The liquid-repellent treatment can be carried out by the same method as described in the first embodiment.

In the ventilation member 1B of the second embodiment having been described above, the inner member 12 and the outer member 13 have exposed surfaces subjected to liquid-repellent treatment. Therefore, it is possible to prevent an oil or a washing liquid from entering the inside of the housing 50 through a gap between the ventilation member 1B and the housing 50.

Furthermore, in a preferred embodiment, each of the inner member 12, the outer member 13, and the sealing member 5 may be individually subjected to liquid-repellent treatment, and then the outer member 13 and the sealing member 5 may be mounted to the inner member 12. In this case, the portions at which the inner member 12, the outer member 13, and the sealing member 5 are fitted together are also subjected to liquid-repellent treatment. Therefore, water leakage caused by capillary action or the like can be prevented more reliably.

Hereinafter, the present invention will be described in more detail with reference to examples. However, the present invention is not limited to the examples described below.

Example 1

Teflon (registered trademark) AF (manufactured by Du Pont-Mitsui Fluorochemicals Company, Ltd.) was dissolved in Fluorinert (registered trademark, manufactured by Sumitomo 3M Limited) to prepare a 3 wt % solution. Capseal (manufactured by Nitto Denko Corporation) was used as the ventilation member 1A. The inner member 2 having the water-proof gas-permeable membrane 10 attached thereto and the outer member 3 were immersed in the solution. In this manner, all of the exposed surfaces of the inner member 2 and the water-proof gas-permeable membrane 10 were subjected to liquid-repellent treatment, and the entire surface of the outer member 3 was subjected to liquid-repellent treatment. Thereafter, the ventilation member 1A was dried to remove the solvent, and was then attached to the housing 50 as shown in FIG. 2. About 2 ml of Mama Lemon (manufactured by Lion Corporation) was dropped to the ventilation member 1A from above. Mama Lemon did not enter the housing.

Example 2

The same procedures as in Example 1 were performed, except that about 2 ml of an ATF (Automatic Transmission Fluid, Auto Fluid D-II manufactured by TOYOTA MOTOR CORPORATION) was dropped to the ventilation member 1A from above. The ATF did not enter the housing.

Example 3

The same procedures as in Example 1 were performed, except that about 2 ml of a window washer liquid (manufactured by KOGA Chemical Mfg Co., Ltd.) was dropped to the ventilation member 1A from above. The window washer liquid did not enter the housing.

Example 4

Teflon (registered trademark) AF (manufactured by Du Pont-Mitsui Fluorochemicals Company, Ltd.) was dissolved in Fluorinert (registered trademark, manufactured by Sumitomo 3M Limited) to prepare a 3 wt % solution. Z3-NTF210SE (manufactured by Nitto Denko Corporation) was used as the ventilation member 1B, and immersed in the solution in a state where the outer member 13 and the sealing member 5 were mounted to the inner member 12 having the water-proof gas-permeable membrane 10 attached thereto. In this manner, all of the exposed surfaces of the inner member 12, the water-proof gas-permeable membrane 10, the outer member 13, and the sealing member 5 were subjected to liquid-repellent treatment. Thereafter, the ventilation member 1B was dried to remove the solvent, and about 2 ml of Mama Lemon (manufactured by Lion Corporation) was dropped to the top of the outer member 13. Thereafter, the outer member 13 was detached, and whether the liquid adhered to the water-proof gas-permeable membrane 10 was examined. It was found that the liquid did not adhere to the water-proof gas-permeable membrane 10.

Example 5

The same procedures as in Example 4 were performed, except that about 2 ml of an ATF was dropped to the top of the outer member 13. Thereafter, the outer member 13 was detached, and whether the ATF adhered to the water-proof gas-permeable membrane 10 was examined. It was found that the liquid did not adhere to the water-proof gas-permeable membrane 10.

The results for Examples 1 to 5 are shown in Table 1.

TABLE 1

| | Type of ventilation member | Liquid-repellent treatment | Type of test liquid | Occurrence of entry or adhesion of liquid |
|---|---|---|---|---|
| Example 1 | Capseal (manufactured by Nitto Denko Corporation) | Done | Mama Lemon (manufactured by Lion Corporation | No entry occurred |
| Example 2 | Capseal (manufactured by Nitto Denko Corporation) | Done | ATF | No entry occurred |
| Example 3 | Capseal (manufactured by Nitto Denko Corporation) | Done | Window washer liquid | No entry occurred |
| Example 4 | Z3-NTF210SE (manufactured by Nitto Denko Corporation) | Done | Mama Lemon (manufactured by Lion Corporation) | No adhesion occurred |

TABLE 1-continued

|  | Type of ventilation member | Liquid-repellent treatment | Type of test liquid | Occurrence of entry or adhesion of liquid |
|---|---|---|---|---|
| Example 5 | Z3-NTF210SE (manufactured by Nitto Denko Corporation) | Done | ATF | No adhesion occurred |

Comparative Example 1

Capseal (manufactured by Nitto Denko Corporation) not subjected to liquid-repellent treatment was used as the ventilation member 1A. The inner member 2 and the outer member 3 were attached to the housing 50 as shown in FIG. 1, and about 2 ml of Mama Lemon (manufactured by Lion Corporation) was dropped to the ventilation member 1A from above. Mama Lemon entered the housing.

Comparative Example 2

Capseal (manufactured by Nitto Denko Corporation) not subjected to liquid-repellent treatment was used as the ventilation member 1A. The inner member 2 and the outer member 3 were attached to the housing 50 as shown in FIG. 1, and about 2 ml of an ATF was dropped to the ventilation member 1A from above. The ATF entered the housing.

Comparative Example 3

Capseal (manufactured by Nitto Denko Corporation) not subjected to liquid-repellent treatment was used as the ventilation member 1A. The inner member 2 and the outer member 3 were attached to the housing 50 as shown in FIG. 1, and about 2 ml of a window washer liquid was dropped to the ventilation member 1A from above. The window washer liquid entered the housing.

Comparative Example 4

Z3-NTF210SE (manufactured by Nitto Denko Corporation) not subjected to liquid-repellent treatment was used as the ventilation member 1B. About 2 ml of Mama Lemon (manufactured by Lion Corporation) was dropped to the top of the outer member 13. Thereafter, the outer member 13 was detached, and whether Mama Lemon adhered to the water-proof gas-permeable membrane 10 was examined. It was found that Mama Lemon adhered to the water-proof gas-permeable membrane 10.

Comparative Example 5

Z3-NTF210SE (manufactured by Nitto Denko Corporation) not subjected to liquid-repellent treatment was used as the ventilation member 1B. About 2 ml of an ATF was dropped to the top of the outer member 13. Thereafter, the outer member 13 was detached, and whether the ATF adhered to the water-proof gas-permeable membrane 10 was examined. It was found that the liquid adhered to the water-proof gas-permeable membrane 10.

The results for Comparative Examples 1 to 5 are shown in Table 2.

TABLE 2

|  | Type of ventilation member | Liquid-repellent treatment | Type of test liquid | Occurrence of entry or adhesion of liquid |
|---|---|---|---|---|
| Comparative Example 1 | Capseal (manufactured by Nitto Denko Corporation) | Not done | Mama Lemon (manufactured by Lion Corporation) | Entry occurred |
| Comparative Example 2 | Capseal (manufactured by Nitto Denko Corporation) | Not done | ATF | Entry occurred |
| Comparative Example 3 | Capseal (manufactured by Nitto Denko Corporation) | Not done | Window washer liquid | Entry occurred |
| Comparative Example 4 | Z3-NTF210SE (manufactured by Nitto Denko Corporation) | Not done | Mama Lemon (manufactured by Lion Corporation) | Adhesion occurred |
| Comparative Example 5 | Z3-NTF210SE (manufactured by Nitto Denko Corporation) | Not done | ATF | Adhesion occurred |

As shown in Table 1, in all of Examples 1 to 5 where the ventilation members 1A and 1B were subjected to liquid-repellent treatment, entry or adhesion of the liquid did not occur. As shown in Table 2, in all of Comparative Examples 1 to 5 where the ventilation members 1A and 1B were not subjected to liquid-repellent treatment, entry or adhesion of the liquid occurred. From the above results, it was confirmed that the ventilation members 1A and 1B subjected to liquid-repellent treatment provide the effect of preventing occurrence of entry and adhesion of liquids.

The present inventors infer that the reason why entry or adhesion of the liquid did not occur in Examples 1 to 5 is that the components subjected to liquid-repellent treatment shed the liquid and thereby prevented entry of the liquid. Furthermore, in Examples 1 to 5, the water-proof gas-permeable membrane 10 was provided. It can be thought that entry of the liquid was prevented both by the presence of the water-proof gas-permeable membrane 10 and by the shedding of the liquid by the components subjected to liquid-repellent treatment.

The ventilation member according to the present invention can be applied also to housings other than housings of automobile electric components. For example, the present invention can be applied also to housings of OA equipment, household electric appliances, and medical devices.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ventilation member capable of being attached to an opening portion of a housing, the ventilation member comprising:
    an inner member configured to be fitted to the opening portion and comprising a tubular portion having a through hole configured to serve as a part of a ventilation path between a space inside the housing and a space outside the housing;

an outer member mounted to the inner member and covering an opening of the through hole; and an annular sealing member mounted so as to be placed around the opening portion in a clearance between the inner member and the housing, wherein the inner member, the outer member, and the sealing member are each individually treated with liquid-repellent treatment, exposed entire outer surfaces of the inner member, the outer member and the sealing member are coated with a first oil-repellent film formed by the liquid-repellent treatment, the outer member is a tubular member having a bottom, and the outer member and the sealing member are mounted to the inner member so that portions of the inner member, the outer member, and the sealing member treated with the liquid-repellent treatment are fitted together repellent treatment are fitted together, wherein unexposed outer surfaces of the inner member, the outer member and the sealing member are coated with a second oil-repellent film formed by liquid-repellent treatment, the second oil-repellent film includes a first portion that coats the inner member, a second portion that coats the outer member, and a third portion that coats the sealing member, and the first portion is in contact with the second portion and the third portion.

2. The ventilation member according to claim 1, further comprising a water-proof gas-permeable membrane attached so as to close an opening of the through hole, the water-proof gas-permeable membrane having an exposed surface treated with liquid-repellent treatment.

3. The ventilation member according to claim 1, further comprising:

a communication path between the inner member and the outer member, the communication path being configured to communicate with a second opening portion and the space outside the housing and to serve as a part of the ventilation path, wherein the through hole has a first opening portion configured to communicate with the space inside the housing, and the second opening portion configured to communicate with the space outside the housing.

4. The ventilation member according to claim 1, wherein the outer member is formed of a resin.

5. The ventilation member according to claim 1, wherein the inner member is formed of an elastomer.

6. The ventilation member according to claim 1, wherein the sealing member is formed of an elastomer.

7. A ventilation structure, comprising:

the ventilation member according to claim 1; and a housing having an opening portion, wherein:

the ventilation member is attached to the opening portion of the housing, the inner member of the ventilation member is fitted to the opening portion, and the sealing member of the ventilation member is placed around the opening portion in a clearance between the inner member and the housing.

8. The ventilation structure according to claim 7, wherein a portion of the first oil-repellent film that covers the sealing member is in contact with the housing.

\* \* \* \* \*